United States Patent [19]

Harper et al.

[11] Patent Number: 5,111,022

[45] Date of Patent: May 5, 1992

[54] COOLING SYSTEM FOR ELECTRON BEAM GUN AND METHOD

[75] Inventors: James L. Harper, Fremont; Charles H. Hill, Mountain Ranch, both of Calif.

[73] Assignee: TFI Telemark, San Jose, Calif.

[21] Appl. No.: 397,521

[22] Filed: Aug. 23, 1989

[51] Int. Cl.⁵ .............................................. B23K 15/00
[52] U.S. Cl. .................................. 219/121.33; 373/11
[58] Field of Search .................. 219/121.33, 121.15, 219/121.16, 121.17; 373/10, 11, 15–17

[56] References Cited

U.S. PATENT DOCUMENTS

| | | | |
|---|---|---|---|
| 2,635,579 | 4/1953 | Chadsey, Jr. | 373/115 |
| 3,235,647 | 2/1966 | Hanks | 373/14 |
| 3,420,977 | 1/1969 | Hanks | 219/121.77 |
| 3,710,072 | 1/1973 | Shrader et al. | 219/121.12 |
| 4,530,100 | 7/1985 | Feuerstein et al. | 373/10 |
| 4,866,239 | 9/1989 | Eguermeier | 373/11 X |

*Primary Examiner*—C. L. Albritton
*Attorney, Agent, or Firm*—Limbach & Limbach

[57] ABSTRACT

A circulating coolant reservoir is used to uniformly cool a removable crucible in an electron beam gun assembly for vaporizing material to be deposited at another location. The outer surface of the crucible is substantially immersed in the coolant reservoir and coolant is circulated around the outer surface from diametrically opposed inlet and outlet lines whose axes are tangent to the reservoir walls and with an upwardly spiraling groove in the crucible outer surface.

19 Claims, 2 Drawing Sheets

COOLING SYSTEM FOR ELECTRON BEAM GUN AND METHOD

BACKGROUND OF THE INVENTION

The invention relates to high vacuum evaporation and deposition systems, and more specifically to a device and method for cooling a crucible in an electron beam gun.

Electron beam guns have frequently been employed to evaporate material in a high vacuum environment for the purpose of ultimately depositing the material on a specific article or location. Such deposition systems typically include an electron emitting source, a crucible for holding the evaporant, and means for directing the electron beam onto the surface of the evaporant. Examples of such systems are described in U.S. Pat. Nos. 3,710,072, 3,235,647, and 3,420,977.

Prior art devices utilize a crucible cooling system consisting of a tubular channel of coolant 38 which flows around the crucible vicinity as shown in FIGS. 1 and 2. The inventors have determined that one of the primary problems with the prior art tubular cooling system is that it fails to uniformly cool the crucible. The result is that sections of the evaporant/crucible interface remain liquid causing crucible material to contaminate the evaporant.

Another problem with the prior art deposition systems is that in order to clean the crucible, the entire electron beam gun assembly must be removed from the vacuum and disassembled, requiring considerable time and effort

SUMMARY OF THE INVENTION

It is an object of the present invention to provide an efficient cooling system and method for a pocket electron beam gun.

Another object of the invention is to provide an electron beam gun design in which a skull of solid evaporant is controllably maintained at the crucible evaporant interface, thereby minimizing evaporant contamination by the crucible material.

Another object of the invention is to provide an electron beam gun design in which the crucible for holding the evaporant is removable, making it possible to clean the crucible without removing the gun from the vacuum environment.

These and other objectives are achieved by a device for cooling evaporant held in a crucible while an electron beam is directed at the surface of the evaporant. The crucible is removably secured in the main body of the electron beam gun assembly. The cooling device includes a reservoir of coolant which substantially surrounds the outer surface of the crucible. The coolant is caused to flow around and up the outer surface of the crucible by directing the coolant into and out of the reservoir from diametrically opposed locations and utilizing a spiral groove in the outer surface of the crucible with the groove spiraling upward in the direction of coolant flow.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE INVENTION

Figure 5:
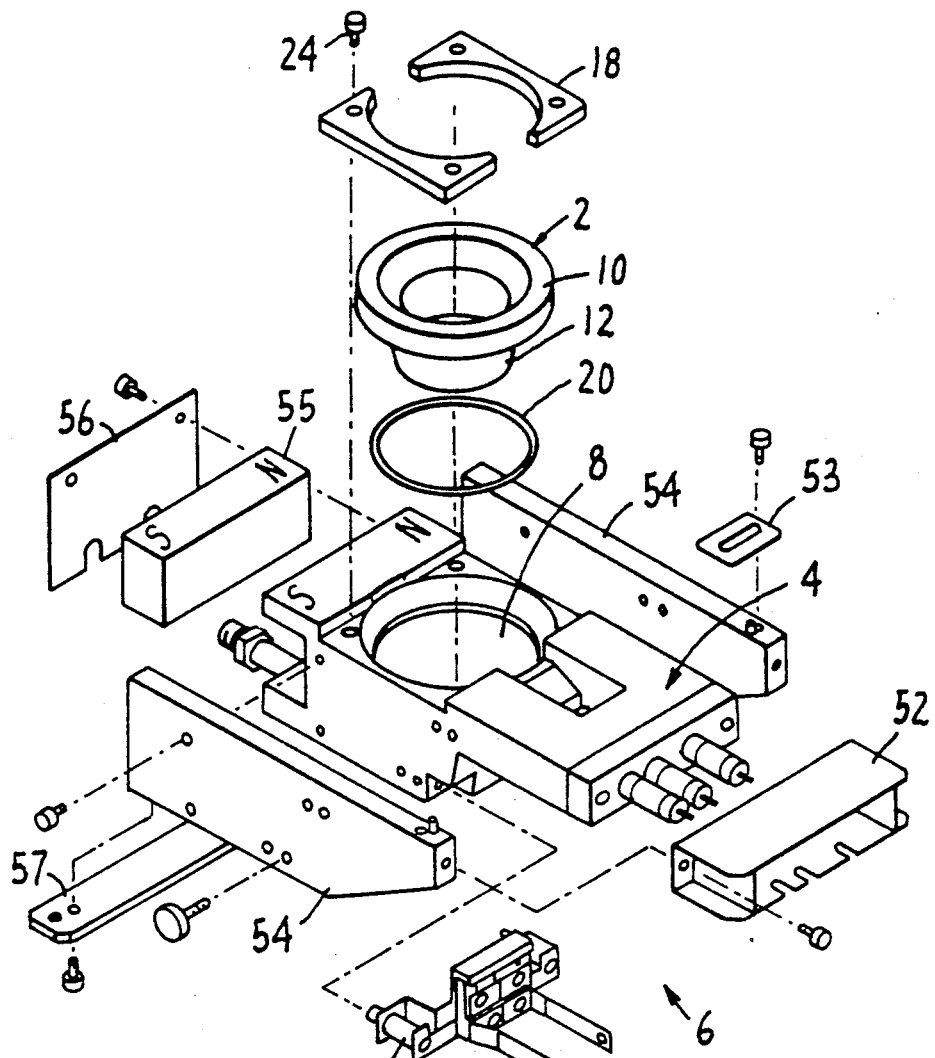
FIG. 5 is a detailed exploded view of the preferred electron beam gun embodiment of the present invention.
Figure 6:
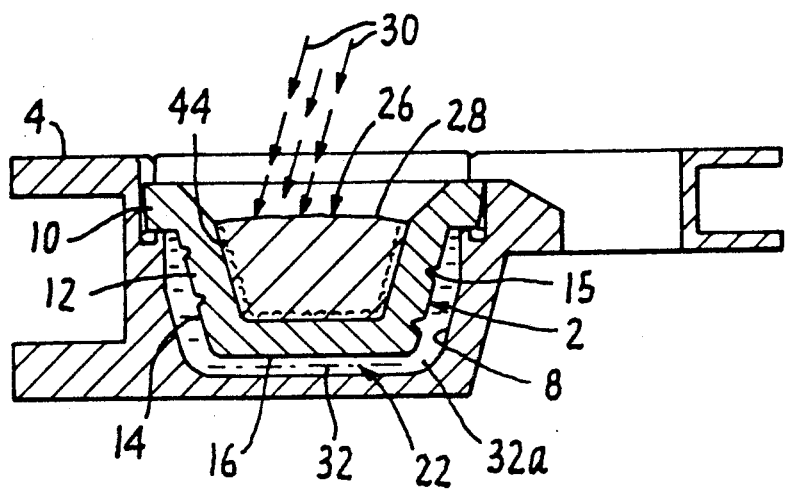
FIG. 6 is a schematic side sectional view of the preferred electron beam gun embodiment of the present invention.

The preferred embodiment of the present invention, as best shown in FIG. 5, is comprised of a crucible 2 which is disposed in a cavity 8 of the main body 4 of an electron beam gun 6. The crucible 2 is preferably made of copper. The crucible 2 has a lipped rim section 10, and a cup section 12. The cup section 12 has a substantially flat bottom side 16 and a substantially conical side 14 as shown in FIG. 6. The cup section 12 of the crucible 2 is designed to hold the evaporant material 26 so that an evaporant surface 28 is exposed.

The lipped rim section 10 of the crucible 2 is secured in the main body 4 of the electron beam gun 6 by means of crucible clamps 18. In the preferred embodiment the clamps 18 are secured to the main body 4 of the electron beam gun 6 by screws 24. The crucible 2 can be removed from the electron beam gun for cleaning by simply removing the screws 24 from the crucible clamps 18, thereby eliminating the need to remove the entire electron beam gun 6 from the high vacuum environment. In the preferred embodiment the crucible 2 can be removed and replaced in approximately five minutes. An "O" ring 20 is sandwiched between the lipped rim section 10 of the crucible 2 and the main body 4 in order to seal the chamber 22 created in the cavity 8 between the outside surface 14 of the crucible 2 and the main body 4 of the electron beam gun 6.

An electron beam 30 schematically illustrated in FIG. 6 is generated and directed onto the evaporant surface 28 by means well known in the art such as described in the patents identified above. This can include an emitter assembly 51 behind a shield 52 and pole pieces 53 connected to magnet arms 54 in turn connected to a permanent magnet 55 behind a shield 56. The magnet arms 54 are connected to a strap 57.

When the crucible 2 is secured in the cavity 8 of the main body 4, the chamber 22 created immediately below the crucible 2 is filled with coolant 32 creating a coolant reservoir 32a. In the preferred embodiment substantially the entire outer surface of the cup section 12 of the crucible 2 is immersed in the coolant reservoir 32a. In one embodiment the coolant 32 is water. Other suitable coolant materials may be employed as well.

Figure 1:
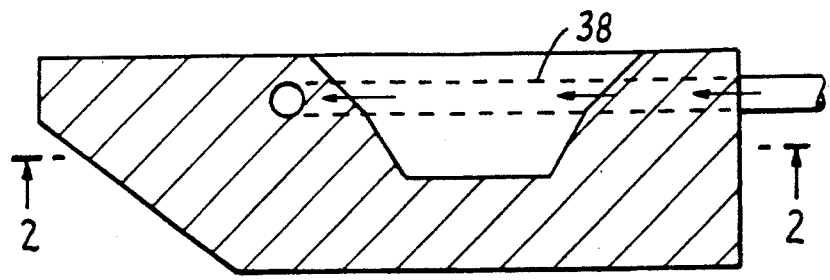
FIG. 1 is a side sectional view of a typical cooling system for an electron beam gun in the prior art.
Figure 2:
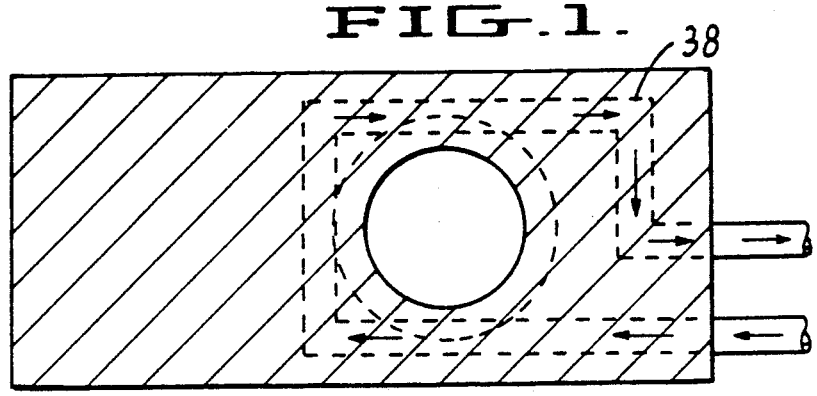
FIG. 2 is a sectional view of the structure of FIG. 1 taken along line 2—2 in the direction of the arrows.
Figure 3:
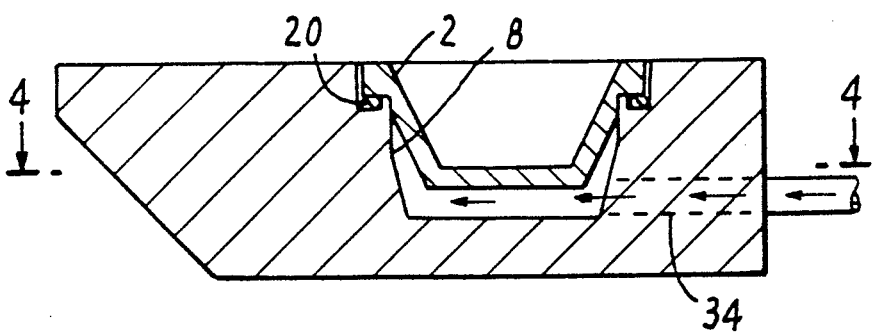
FIGS. 3 and 4 are views similar to FIGS. 1 and 2 and showing the cooling system for the electron beam gun of the present invention.
Figure 4:
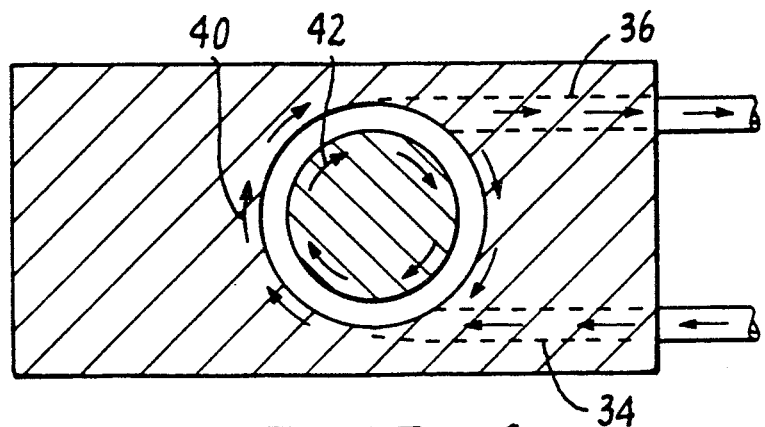

In the preferred embodiment the coolant reservoir 32a is served by supply lines including a coolant input line 34 and a coolant output line 36 as shown in FIG. 4. The input and output lines 34 and 36 intersect the side wall of the cavity 8 at diametrically opposed locations and at angles with the axes of the lines 34 and 36 substantially tangential to the side walls of the cavity 8 producing a rotary motion to the coolant in the chamber 22 for exposing a very large surface area of the crucible to flowing coolant.

The diameter of the input and output lines 34 and 36 may be varied to adjust the turnover of coolant 32 in the reservoir 32a provided the input and output capacities are equivalent. Suitable diameters for the supply lines include ⅜ inch and ½ inch. When the supply lines have a diameter of ⅜ inch, water coolant will flow at a rate of up to 3 gpm.

The conical out side 14 of the crucible 2 can be provided with a spiral groove 15 spiraling up the side 14 in the direction of coolant flow in the chamber 22.

When coolant supply lines 34 and 36 are employed coolant currents 40 and 42 are generated in the coolant reservoir 32a as shown in FIG. 4. Coolant current 40 circulates around the substantially conical side 14 of the cup section 12 of the crucible 2. Coolant current 42 circulates around the bottom side 16 of the cup section of the crucible 2.

Other means for creating coolant currents in the reservoir 32a, for example stirring mechanisms, are considered to be within the scope of the present invention.

By employing the cooling system as described above, a skull 44 of solid evaporant is formed at the crucible/evaporant interface as shown in FIG. 6. The skull 44 functions as a protective barrier minimizing evaporant contamination from the crucible material.

Although the present invention has been shown and described with respect to preferred embodiments, various changes and modifications which are obvious to a person skilled in the art to which the invention pertains are deemed to lie within the spirit and scope of the invention.

What is claimed is:

1. In an electron beam gun having a main body, a crucible for holding evaporant, the crucible having a lipped rim section and a cup section, said cup section having an external surface, an electron beam gun for directing an electron beam onto material in the crucible and means for cooling the crucible, the improvement comprising:

said main body provided with a cavity for receiving said crucible, said main body being adapted to support the lipped rim section of the crucible creating a coolant chamber around substantially the entire external surface of the crucible's cup section; and means for circulating coolant throughout said coolant chamber, whereby a skull of solid evaporant is formed at the crucible/evaporant interface forming a protective barrier minimizing evaporant contamination from the crucible.

2. In an electron beam gun having a main body, a crucible for holding material for evaporation, the crucible having an external surface, an electron beam gun for directing an electron beam onto material in the crucible and means for cooling the crucible, the improvement comprising:

said main body provided with a cavity for receiving said crucible with a chamber in said cavity below the external surface of said crucible;
means for circulating a coolant in said chamber around said external surface of said crucible, said external surface of said crucible including a substantially flat bottom and a substantially conical side, wherein the entire bottom and side of said outer surface are immersed in said coolant, said crucible external conical side including a spiral groove spiraling up in the circulating direction of said coolant.

3. A device according to claim 2 wherein said cup section of said crucible includes a substantially flat bottom and a substantially conical side, wherein the entire bottom and side of said crucible cup section are immersed in said coolant.

4. A device according to claim 3 wherein said crucible outer conical side includes a spiral groove spiraling up in the circulating direction of said coolant.

5. A device according to claim 1 wherein said means for circulating includes:
  i) an input line connected to said coolant chamber for delivering coolant; and
  ii) an output line connected to said coolant chamber for carrying coolant out of said chamber, whereby coolant currents are created by the constant flow of coolant into and out of the chamber.

6. A device according to claim 5 wherein the axes of said input and output lines are substantially tangent to the side walls of the cavity.

7. A device according to claim 5 wherein the axes of said input and output lines are substantially tangent to the side walls of the cavity on opposite ends of a diameter thereof.

8. A pocket electron beam gun comprising:
  (a) at least one crucible for holding material for vaporization so that an upper surface of said material is exposed, said crucible having a lipped rim section and a cup section, said cup section having an external surface;
  (b) a main body having a cavity larger than said crucible, said cavity adapted to receive said crucible in the upper portion thereof leaving a coolant chamber therebelow;
  (c) means for removably attaching said crucible to said main body in said cavity;
  (d) means for directing an electron beam at said surface of said material;
  (e) means for causing said electron beam to sweep across said surface of said material; and
  (f) means for circulating coolant throughout said chamber to cool said crucible, wherein the external surface of the crucible cup section is substantially entirely immersed in coolant.

9. A pocket electron beam gun comprising:
  (a) at least one crucible for holding material for vaporization so that an upper surface of said material is exposed, said crucible having an outside conical surface including a spiral groove;
  (b) a main body having a cavity larger than said crucible, said cavity adapted to receive said crucible in the upper portion thereof and leaving a chamber therebelow for receiving a cooling fluid;
  (c) means for removably attaching said crucible to said main body in said cavity;
  (d) means for directing an electron beam at said surface of said material;
  (e) means for directing an electron beam at said surface of said material;
  (e) means for causing said electron beam to sweep across said surface of said material; and
  (f) means for circulating cooling fluid to said chamber to cool said crucible.

10. A pocket electron gun according to claim 8 wherein said crucible has an outside conical surface including a spiral groove.

11. A pocket electron beam gun according to claim 8 wherein said means for circulating includes:
(a) an input line connected to said cavity for delivering coolant to said reservoir;
(b) an output line connected to said cavity for carrying coolant away from said reservoir
whereby coolant currents are created in said cavity by the constant flow of coolant into and out of said reservoir.

12. A pocket electron beam gun according to claim 11 wherein said crucible has an outside conical surface including a spiral groove spiraling up in the circulating direction of said coolant.

13. A pocket electron beam gun according to claim 11 wherein the axes of said input and output lines are substantially tangent to side walls of said cavity thereby producing a rotary motion to said coolant.

14. A pocket electron beam gun according to claim 13 wherein said input and output lines are substantially tangent to said cavity side walls at the opposite ends of a diameter thereof.

15. A method for vaporizing a material comprising the steps of:
(a) placing said material in a crucible so that an upper surface of said material is exposed wherein said crucible has a lipped rim section and a cup section, said cup section having an outer surface;
(b) directing an electron beam at said upper surface of said material; and
(c) immersing substantially the entire outer surface of said crucible cup section in a coolant wherein said directing step and said immersing step are carried out substantially simultaneously.

16. A method for vaporizing a material according to claim 15 further comprising the step of:
(d) circulating said coolant around said outer surface of said crucible.

17. A method for vaporizing a material according to claim 16 wherein said circulating step is accomplished by continuously pumping said coolant into and away from a location near said outer surface of said crucible.

18. A method for vaporizing a material according to claim 17 including spiraling said coolant up the outer surface of said crucible.

19. A method for vaporizing a material comprising the steps of:
(a) placing said material in a crucible so that an upper surface of said material is exposed wherein said crucible has an outer surface;
(b) directing an electron beam at said upper surface of said material;
(c) immersing substantially the entire outer surface of said crucible in a coolant wherein said directing step and said immersing step are carried out substantially simultaneously; and
(d) circulating the coolant around said crucible outer surface by continuously pumping the coolant into and away from a location near the crucible outer surface and spiraling said coolant up the outer surface of said crucible.

* * * * *